United States Patent
Yoo (10) Patent No.: US 7,465,142 B2
(45) Date of Patent: Dec. 16, 2008

(54) METHOD AND APPARATUS FOR PICKING UP A SEMICONDUCTOR CHIP, METHOD AND APPARATUS FOR REMOVING A SEMICONDUCTOR CHIP FROM A DICING TAPE, AND A METHOD OF FORMING A PERFORATED DICING TAPE

(75) Inventor: Cheol-Joon Yoo, Cheonan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 114 days.

(21) Appl. No.: 10/981,468

(22) Filed: Nov. 5, 2004

(65) Prior Publication Data

US 2005/0095100 A1    May 5, 2005

Related U.S. Application Data

(62) Division of application No. 10/435,202, filed on May 12, 2003, now Pat. No. 6,869,264.

(30) Foreign Application Priority Data

Nov. 11, 2002    (KR) ............................... 2002-69666

(51) Int. Cl.
*B65B 21/02* (2006.01)
(52) U.S. Cl. .................. 414/416.09; 198/493
(58) Field of Classification Search ............ 414/416.09; 198/493; 29/743, 760; 156/344, 584; 438/464, 438/976
See application file for complete search history.

(56) References Cited

U.S. PATENT DOCUMENTS 3,785,507 A    1/1974    Wiesler et al. ................ 29/700
3,906,614 A    9/1975    Rayburn ...................... 29/837

(Continued)

FOREIGN PATENT DOCUMENTS

KR    2000-31043    6/2000

OTHER PUBLICATIONS

Korean Office Action, Notice to Submit Response, Aug. 18, 2004.

(Continued)

*Primary Examiner*—Douglas A Hess
(74) *Attorney, Agent, or Firm*—Harness, Dickey & Pierce, P.L.C.

(57) ABSTRACT

A method and apparatus for picking up a semiconductor chip, a method and apparatus for removing a semiconductor chip from a dicing tape, and a method of forming a perforated dicing tape are provided. Air may be blown through air holes in a dicing tape to at least partially separate the semiconductor chip from the dicing tape and/or create a space between the semiconductor chip to weaken the adhesion of the dicing tape to the semiconductor chip. The semiconductor chip may then be picked up by a removal member and completely removed from the dicing tape. Semiconductor chips that are not to be removed may be vacuum-suctioned to the dicing tape. UV radiation or heat may be applied to weaken the adhesion of the dicing tape. The semiconductor chip may be detected by an optical detector. Removing the semiconductor chips by air reduces stress and damage to the semiconductor chips.

7 Claims, 5 Drawing Sheets

U.S. PATENT DOCUMENTS

| | | | |
|---|---|---|---|
| 3,937,386 A | 2/1976 | Hartleroad et al. | 228/180.21 |
| 4,776,744 A | 10/1988 | Stonestreet et al. | 414/217 |
| 4,850,780 A * | 7/1989 | Safabakhsh et al. | 414/416.1 |
| 4,859,369 A * | 8/1989 | Baretz et al. | 252/700 |
| 4,915,565 A | 4/1990 | Bond et al. | 29/740 |
| 5,098,501 A * | 3/1992 | Nishiguchi | 156/275.5 |
| 5,988,355 A | 11/1999 | Merour | 198/493 |
| 6,019,564 A | 2/2000 | Kiyokawa et al. | 414/223.01 |
| 6,709,543 B2 * | 3/2004 | Kurosawa | 156/344 |
| 6,751,853 B2 * | 6/2004 | Farnworth et al. | 29/743 |
| 6,752,896 B2 * | 6/2004 | Ong et al. | 156/344 |
| 6,824,643 B2 * | 11/2004 | Yoshimoto et al. | 156/344 |
| 6,869,264 B2 * | 3/2005 | Yoo | 414/416.09 |
| 7,238,258 B2 * | 7/2007 | Park et al. | 156/344 |
| 7,284,941 B2 * | 10/2007 | Yoo | 414/416.09 |
| 7,306,695 B2 * | 12/2007 | Kasai | 156/344 |

OTHER PUBLICATIONS

English translation of Korean Publication No. 2000-31043.

\* cited by examiner

METHOD AND APPARATUS FOR PICKING UP A SEMICONDUCTOR CHIP, METHOD AND APPARATUS FOR REMOVING A SEMICONDUCTOR CHIP FROM A DICING TAPE, AND A METHOD OF FORMING A PERFORATED DICING TAPE

This application is a divisional of, and claims priority under 35 U.S.C. § 120 on, U.S. application Ser. No. 10/435,202, filed May 12, 2003, now U.S. Pat. No. 6,869,264, which further claims priority under 35 U.S.C. §119 to Korean Patent Application No. 2002-69666, filed on Nov. 11, 2002 in the Korean Intellectual Property Office, the contents of which are incorporated herein by reference in their entirety.

BACKGROUND OF THE INVENTION

1. Field of the Invention

The present invention relates generally to semiconductor assembly processes, and more particularly, to a method and apparatus for picking up a semiconductor chip by blowing air through air holes in a dicing tape to separate the semiconductor chip from the dicing tape and then picking up the semiconductor chip. A method of removing a semiconductor chip from a dicing tape and a method for forming a perforated dicing tape are also provided.

2. Description of the Related Art

In semiconductor assembly processes, dividing a wafer into semiconductor chips may be termed "sawing" or "dicing." After the wafer has been diced or sawed into individual semiconductor chips, each of the semiconductor chips may be separated from the wafer and attached to a lead frame. To perform a dicing process, dicing tape may be attached to the back of the wafer. A needle pick-up method is conventionally used to separate a semiconductor chip from the dicing tape. However, because the needle applies physical stress to the semiconductor chip, the needle may damage the chip as it forcibly pushes the semiconductor chip off the dicing tape.

Figure 1:
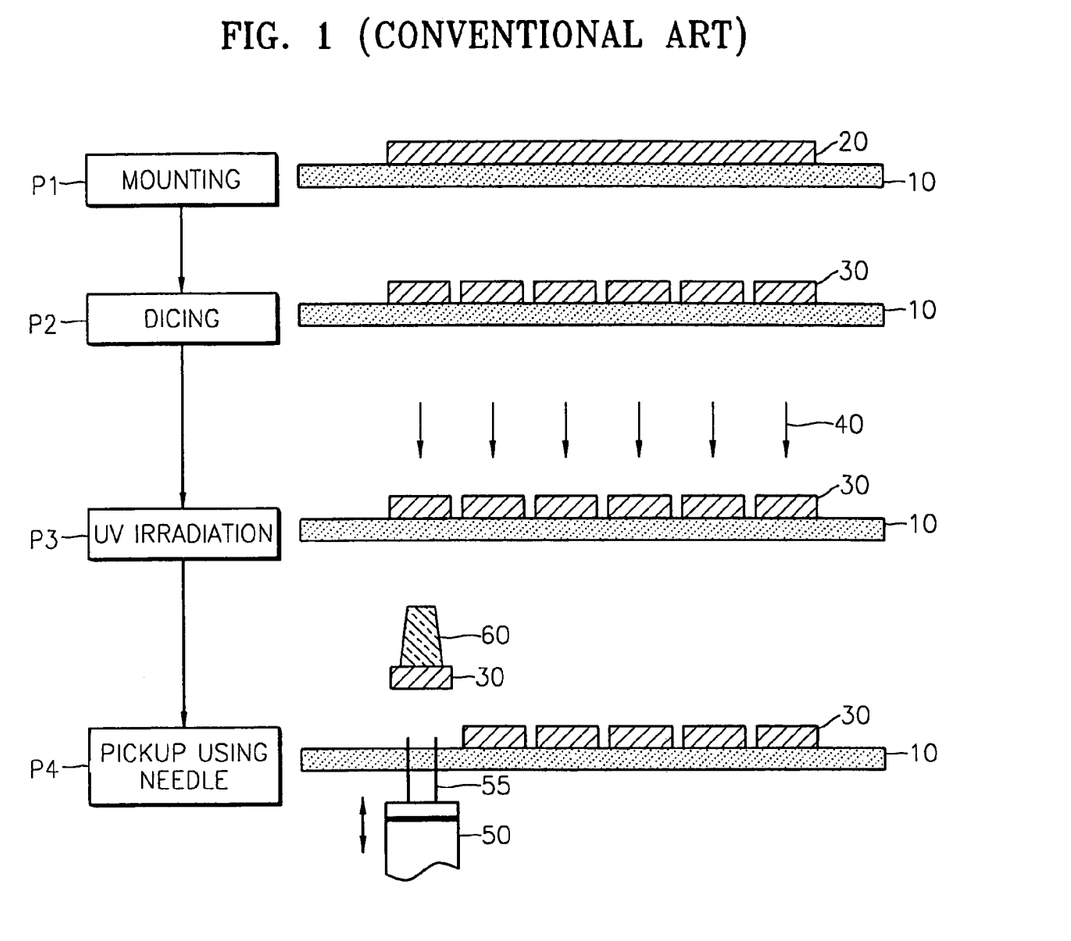
FIG. 1 is an illustration of a conventional chip pick-up method.

Referring to FIG. 1, in a conventional needle pick-up method, a wafer 20 may be mounted to a dicing tape 10 (P1). Next, the wafer 20 may be divided into separate chips 30 by sawing or dicing the wafer (P2). UV radiation 40 may be applied to weaken the adhesion of the dicing tape 10 (P3). The chips 30 may then be removed from the dicing tape 10 (e.g., "picked up") using a needle 50 that may have one or more pins 55. For example, the needle 50 may be positioned under the dicing tape 10 (and the semiconductor chip 30), thereby pushing the semiconductor chip 30 off the dicing tape 10. The pushed-up semiconductor chip 30 may then be picked up by a suction collection member 60 positioned over the chip 30. The semiconductor chip 30 may then be attached to a mounting pad of a lead frame (not shown).

When the needle pick-up method described above is used to remove the semiconductor chip 30 from the dicing tape 10, the sharp end of the needle pins 55 used to penetrate the dicing tape 10 and force the semiconductor chip 30 off of the dicing tape 10 may apply physical stress to the semiconductor chip 30. This stress on the semiconductor chip 30 may physically damage the semiconductor chip 30, such as by cracking the semiconductor chip 30 or breaking the edges of the semiconductor chip 30. In addition, because semiconductor chip thickness has been reduced so that thin semiconductor packages that have a thickness of several tens of μm or multi chip packages that have a thickness of several hundred μm or less may be formed, the conventional needle pick-up method may cause severe damage to such a thin chip. Because a damaged semiconductor chip 30 is not easily separated from the dicing tape 10 and leads to defective units, manufacturing costs may be increased.

SUMMARY OF THE INVENTION

In at least one exemplary embodiment of the present invention, a method for picking up a semiconductor chip is provided. Air may be blown, e.g., by an air dispensing module, from under a dicing tape through air holes in the dicing tape to separate the semiconductor chip from the dicing tape. The air dispensing module may be a nozzle or a vacuum and air blowing support. The blown air may create a space between the semiconductor chip and the dicing tape, which may weaken the adhesion of the dicing tape to the semiconductor chip. A removal member, e.g., a vacuum holder, may then pick up the semiconductor chip and remove it from the dicing tape. Optionally, UV irradiation or heat may be applied to weaken the adhesion of the dicing tape. Both the removal member and the air dispensing module may be movable, and the removal member and air dispensing module may be positioned above and below the semiconductor chip respectively prior to blowing air through the holes in the dicing tape. The air dispensing module may be vacuum-suctioned to the dicing tape. The vacuum suction may occur at substantially the same time as the air is blown through the air holes in the dicing tape. Semiconductor chips which are not to be removed from the dicing tape may be vacuum-suctioned to the dicing tape.

In at least one exemplary embodiment of the present invention, an apparatus for picking up a semiconductor chip is provided. The apparatus may include an air dispensing module which may blow air through air holes in a dicing tape and a removal member, e.g., a vacuum holder, which may remove the semiconductor chip from the dicing tape. The air dispensing module may be a nozzle or a vacuum and air blowing support. The removal member may include at least one vacuum portion to hold the semiconductor chip. The vacuum portion may be positioned at the end of the vacuum holder located closest to the semiconductor chip. The vacuum portion may be substantially the same size as the semiconductor chip. In addition, the removal member may hold the semiconductor chips substantially evenly to reduce the occurrence of bending the semiconductor chips due to the vacuum suction applied to the surface of the semiconductor chip. Both the air dispensing module and the removal member may be movable. The apparatus may also include an optical sensing device, such as a camera, which may determine the position of the semiconductor chip.

In at least one exemplary embodiment of the present invention, a method of forming a perforated dicing tape is provided. The perforated dicing tape may be formed by coating an adhesive layer on a base film to create a dicing tape. The dicing tape may then be perforated to create a plurality of air holes. The adhesiveness of the adhesive layer may be adjusted by using UV radiation or heat. The base film may be a vinyl chloride resin or a polyolefin film. The holes formed in the dicing tape may be formed in a pattern, or they may be substantially uniformly distributed on the dicing tape.

BRIEF DESCRIPTION OF THE DRAWINGS

Exemplary embodiments of the present invention will be readily understood with reference to the following detailed description thereof provided in conjunction with the attached drawings in which.

DETAILED DESCRIPTION OF EXEMPLARY EMBODIMENTS OF THE INVENTION

Exemplary embodiments of the present invention will now be described more fully with reference to the accompanying drawings, in which exemplary embodiments of the invention are shown. This invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art. In the drawings, the thicknesses of the layers and regions are exaggerated for clarity. Thus, the present invention should not be limited to the relative sizes or intervals shown in the appended drawings. It will also be understood that when an element is referred to as being "on" another element, it may be located directly on the other element or intervening elements may be present. It is to be further understood that when an element is referred to as being "under" or "below" another element, it may be located directly under or directly below the element or intervening elements may be present. In addition, it is to be understood that when an element is referred to as being "over" or "above" another element, it may be located directly over or directly above the element, or intervening elements may be present. It is to be further understood that when an element is referred to as being "substantially uniformly distributed," the element may be uniformly distributed or close to uniformly distributed. Additionally, it should be understood that when an element is referred to as being "substantially uniformly held", it may be uniformly held or close to uniformly held. It is also to be understood that when occurrences are described as occurring at "substantially the same time", the occurrences may occur at the same time or nearly at the same time. Throughout the specification, like numbers refer to like elements.

Figure 2:
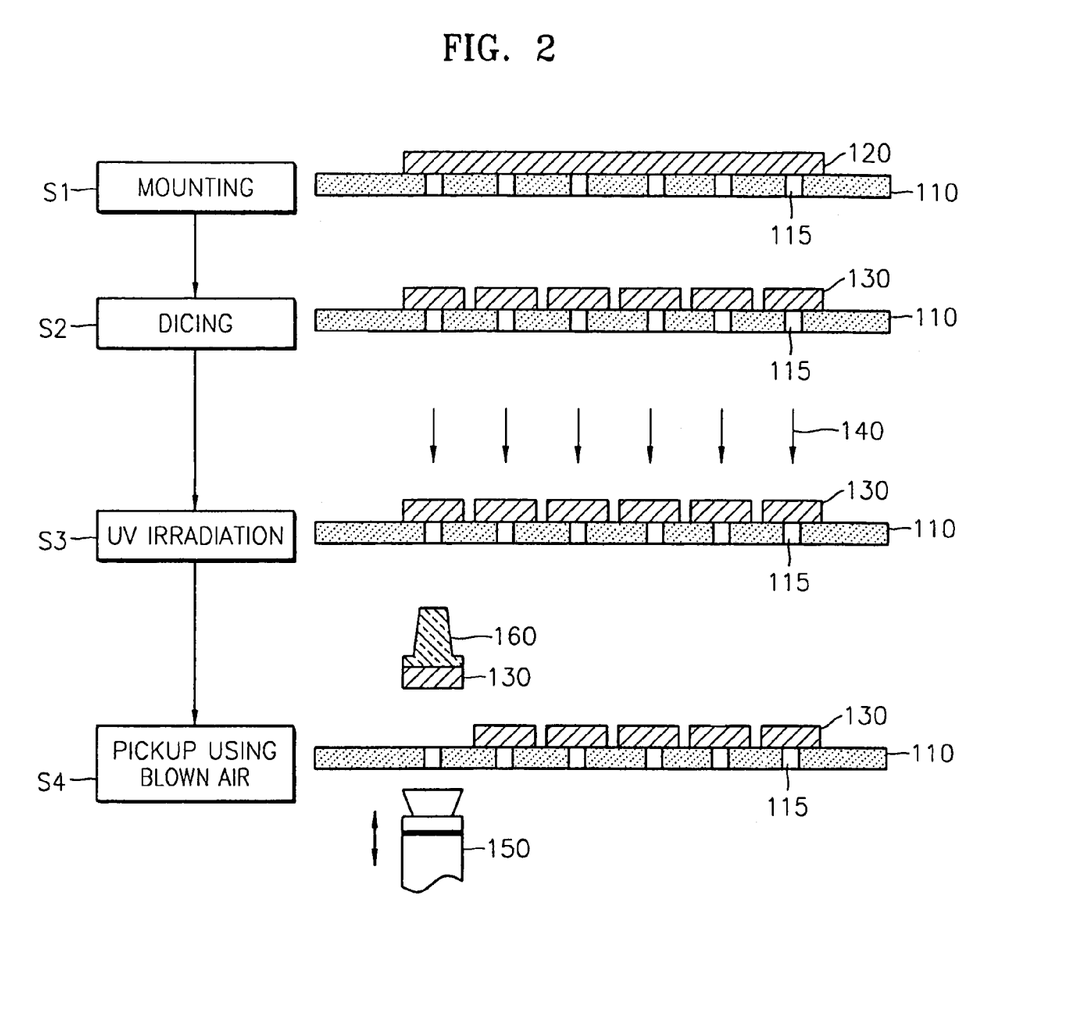
FIG. 2 is an illustration of a chip pick-up method according to at least one exemplary embodiment of the present invention.

FIG. 2 illustrates a chip pick-up method using an air blowing technique according to at least one exemplary embodiment of the present invention. Referring to FIG. 2, a dicing tape 110 having a plurality of air holes 115 may be prepared. In step (S1), a wafer 120 may be mounted onto the dicing tape 110. A dicing process may be carried out to divide the wafer 120 into separate semiconductor chips 130 (S2). To facilitate the separation of the semiconductor chips 130 from the dicing tape 110, UV irradiation 140 may be applied in step (S3) to weaken the adhesion of the dicing tape 110. Alternatively, heat may be applied to weaken the adhesion of the dicing tape 110. A pick-up process may then carried out using blown air (S4).

In particular, air may be blown from under the dicing tape 110 through the air holes 115 by an air dispensing module 150 to separate the semiconductor chip 130 to be removed from the dicing tape 110 and/or create a space (not shown) between the semiconductor chip 130 and the dicing tape 110 to weaken the adhesion of the dicing tape 110 to the semiconductor chip 130 and assist in the separation of the semiconductor chip 130 from the dicing tape 110. The semiconductor chip 130 to be removed may then be picked up by a removal member, e.g., a vacuum holder 160, positioned over the semiconductor chip 130 and removed from the dicing tape 110. When air is blown through the air holes 115 to dislodge the selected semiconductor chip 130, the remaining (e.g., non-selected) semiconductor chips 130 may be vacuum-suctioned by a vacuum module (not shown) and fixed to the dicing tape 110 so as to be immobile.

To pick up multiple semiconductor chips 130, the pick-up process illustrated in step (S4) may be conducted several times, each time for a different semiconductor chip 130. For example, once one semiconductor chip 130 has been picked up, the next semiconductor chip 130 to be picked up may be moved so that it is positioned over the air dispensing module 150 and under the vacuum holder 160. Alternatively, the vacuum holder 160 and the air dispensing module may move until they are positioned above and below the semiconductor chip 130 respectively.

Air pressure generated by the air blown from the air dispensing module 150 reduces the physical stress which may be applied to the semiconductor chip 130. Also, in exemplary embodiments of the present invention, the air holes 115 may be positioned substantially uniformly under the semiconductor chip 130 to reduce the concentration of stress on one portion of the semiconductor chip 130. As a result, thin semiconductor chips 130, e.g., semiconductor chips 130 having a thickness of several tens of μm or less, may be picked up with a reduction in damage to them. Accordingly, in an assembly process that uses thin wafers 120, and therefore thin semiconductor chips 130, the semiconductor chips 130 may have a reduced occurrence of damage, and a die attaching process may then be effectively carried out. Therefore, if a semiconductor assembly process is conducted using a thin wafer 120 (e.g., a wafer 120 having a thickness of several tens of μm or less), when the corresponding semiconductor chips 130 are separated from the dicing tape 110, thin semiconductor packages and multiple chip packages that have a thickness of several hundred μm or less may be fabricated. In addition, exemplary embodiments of the present invention may be used to remove semiconductor chips 130 that have a large size from the dicing tape 110.

Figure 3:
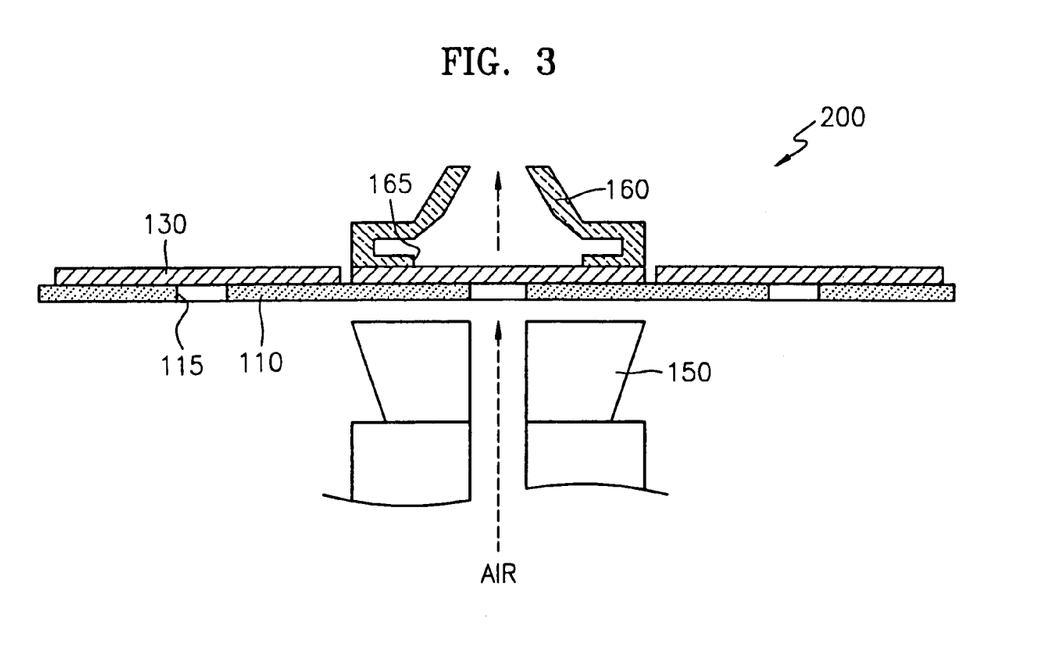
FIG. 3 is a cross-sectional view of a chip pick-up apparatus according to at least one exemplary embodiment of the present invention.

FIG. 3 is a detailed cross-sectional view of a chip pick-up apparatus according to at least one exemplary embodiment of the present invention. The chip pick-up apparatus 200 may include the dicing tape 110 that has a plurality of air holes 115, a removal member, e.g., the vacuum holder 160, positioned above the semiconductor chips 130 to support the semiconductor chip 130 and/or separate the semiconductor chip 130 from the dicing tape 110, and the air dispensing module 150, e.g., a nozzle 150, located under the semiconductor chips to blow air from under the dicing tape 110 through the air holes 115. The arrow shown in FIG. 3 indicates the direction of air flow.

The vacuum holder 160 may move to a position above the semiconductor chip 130 to be removed to remove, e.g., pick up, the semiconductor chip 130 from the dicing tape 110. The vacuum holder 160 may include one or more suction portions 165, which may be positioned at the end of the vacuum holder 160 closest to the semiconductor chip 130, for vacuum-suctioning the semiconductor chip 130 to the vacuum holder. The vacuum holder 160 may hold the semiconductor chips 130 substantially uniformly (e.g., substantially evenly) to reduce the occurrence of bending the semiconductor chips 130 due to the vacuum suction applied to surfaces of the semiconductor chips 130. If the semiconductor chips 130 are not substantially evenly held by the vacuum holder 160, they may be deformed or otherwise damaged. In addition, the portion of the vacuum holder 160 that may be adhered to the surface of the semiconductor chip 130 should not be excessively smaller than the chip, and may be substantially the same size as the semiconductor chip 130.

Picking up semiconductor chips 130 using the chip pick-up apparatus 200 illustrated in FIG. 3 may be conducted as follows. The position of the semiconductor chip 130 to be picked up may be detected and selected by a sensor, such as a camera or other optical sensing device. The vacuum holder 160 may move to a location above the selected semiconductor chip 130 and then may move, e.g., in a downward direction, to adhere itself to the surface, e.g., a top surface, of the semiconductor chip 130, such as by vacuum suction. The air dispensing module 150 may move to a position below the selected semiconductor chip 130 and then may move, e.g., in an upward direction, to blow air toward the air holes 115 of the dicing tape 110. The vacuum holder 160 and the air dispensing module 150 may move at substantially the same time.

The blown air may push the semiconductor chip 130 away from the dicing tape 110, thereby creating a space (not shown) between the semiconductor chip 130 and the dicing tape 110. Thus, air may be diffused along an interface between the semiconductor chip 130 and the dicing tape 110 via the created space, thereby separating the semiconductor chip 130 from the dicing tape 110. At the same time, the vacuum holder 160 may assist in the diffusion of air along the interface between the dicing tape 110 and the semiconductor chip 130 by moving in a direction away from the dicing tape, e.g., in an upward direction. Thereafter, the vacuum holder 160 may continue to move away from the dicing tape 110 to completely remove the semiconductor chip 130 from the dicing tape 110.

Figure 4:
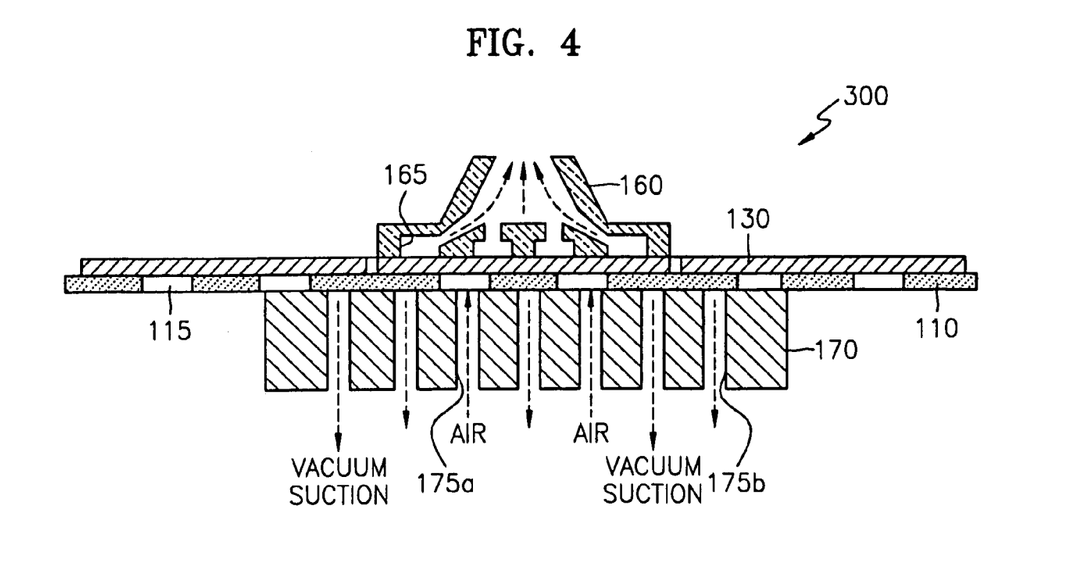
FIG. 4 is a cross-sectional view of a chip pick-up apparatus according at least one other exemplary embodiment of the present invention.

FIG. 4 is a cross-sectional view a chip pick-up apparatus according to at least one exemplary embodiment of the present invention. As shown in FIG. 4, a chip pick-up apparatus 300 includes a vacuum and air blowing support 170 positioned on a side of the dicing tape 110 that is opposite to the side in which the semiconductor chips 130 may be placed. The arrows in FIG. 4 indicate the direction of air flow.

The vacuum and air blowing support 170 may be adhered to the bottom of the dicing tape 110 and may support the semiconductor chip 130 for a pick-up process. The vacuum and air blowing support 170 may include a plurality of holes 175a and 175b. When the holes 175a are aligned with the air holes of the dicing tape 110, air may be blown through the holes 175a, thereby pushing the bottom of the semiconductor chip 130 away from the dicing tape 110. A vacuum suction may be achieved via the holes 175b, which are not aligned with the air holes 115 of the dicing tape 110. Thus, the dicing tape may be securely held by the vacuum suction. The vacuum suction may occur at substantially the same time that the air is blown through the holes 175a.

Picking up semiconductor chips 130 using the chip pick-up apparatus 300 illustrated in FIG. 4 may be conducted as follows. The vacuum holder 160 may move to a location above the semiconductor chip 130 to be picked up and then may move, e.g., in a downward direction, to adhere to a surface of the semiconductor chip 130, e.g., a top surface, by vacuum pressure created by the vacuum holder 160. The vacuum and air blowing support 170 may move to a position under the selected semiconductor chip 130 and then may move, e.g., in an upward direction, so that it is positioned to blow air through the air holes 175a. The vacuum and air blowing support 170 may be adhered to the bottom of the dicing tape 110 via the vacuum pressure achieved by the holes 175b. The positioning of the vacuum holder 160 above the semiconductor chip 130 to be picked up and the positioning of the vacuum and air blowing support 170 below the semiconductor chip 130 to be picked up may occur at substantially the same time.

Next, air may be blown through the holes 175a. The blown air may separate at least a portion of the bottom of the semiconductor chip 130 from the dicing tape 110, and may be diffused along an interface between the semiconductor chip 130 and the dicing tape 110, thereby causing the semiconductor chip 130 to separate from the dicing tape 110. The vacuum holder 160 may assist in the diffusion of air along the interface between the dicing tape 110 and the semiconductor chip 130 by moving in a direction away from the dicing tape 110, e.g., in an upward direction. The vacuum holder 160 may continue to move away from the dicing tape 110 until the semiconductor chip 130 is completely removed from the dicing tape 110.

According to the exemplary chip pick-up apparatuses 200 and 300 described above and set forth in FIGS. 3 and 4, physical stress may not be concentrated on one portion of the semiconductor chip 130. As a result, the occurrence of cracks or broken edges on the semiconductor chip 130 may be reduced. In addition, the number of defective units caused by damaged semiconductor chips 130 may be reduced, the characteristics and reliability of a semiconductor device formed from semiconductor chips may be improved, productivity may be enhanced, and the manufacturing costs may be reduced.

Figure 5:
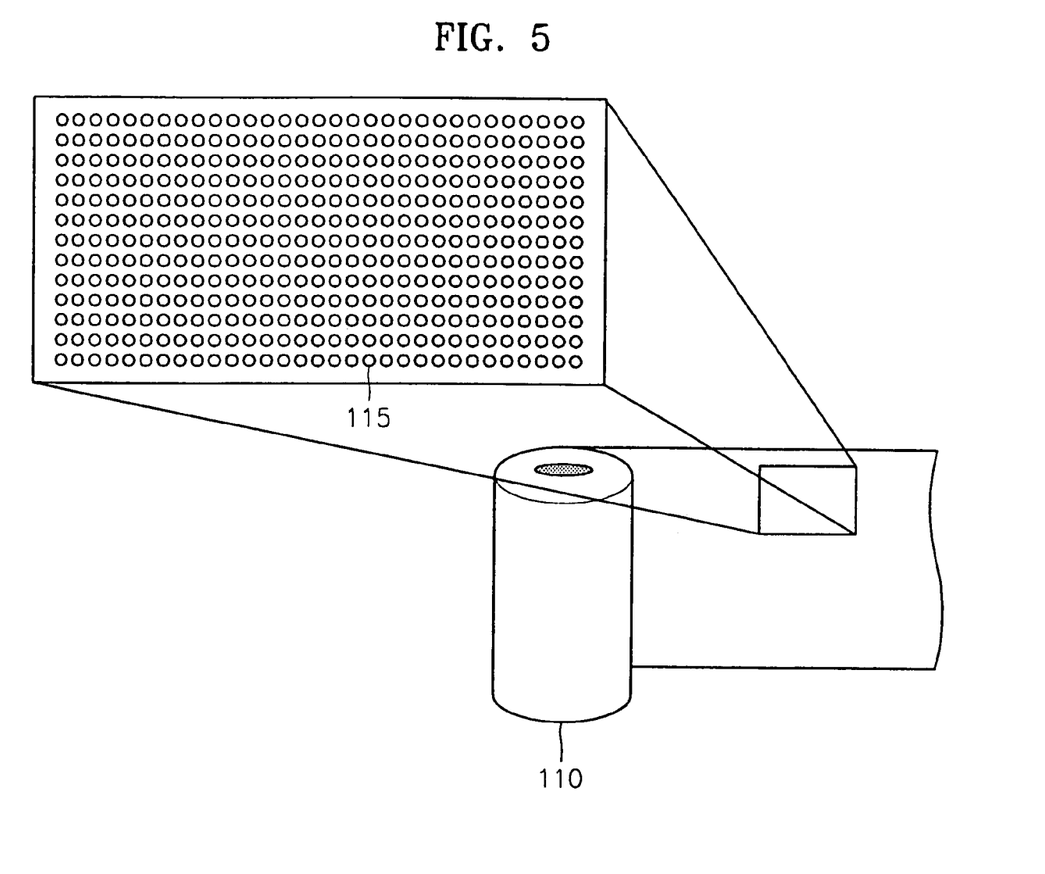
FIG. 5 is an illustration of a dicing tape that has a plurality of air holes according to at least one exemplary embodiment of the present invention.

FIG. 5 is an illustration of a dicing tape that has a plurality of air holes according to at least one exemplary embodiment of the present invention. As shown in FIG. 5, the dicing tape 110 may include a plurality of air holes 115 through which air may be passed, e.g., blown through. For example, air may be blown by the air dispensing module 150 or the vacuum and air blowing support 170. The dicing tape 110 may be formed by coating an adhesive layer on a base film, which may be a vinyl chloride resin or a polyolefin resin. The adhesiveness of the adhesive layer may be adjusted by using UV radiation or heat. In particular, the use of UV radiation or heat may weaken the adhesion of the dicing tape 110 to assist in separating the semiconductor chip 130 from the dicing tape 110, or vice versa. The air holes 115 may be formed perforating both the adhesive layer and the base film.

Figure 6:
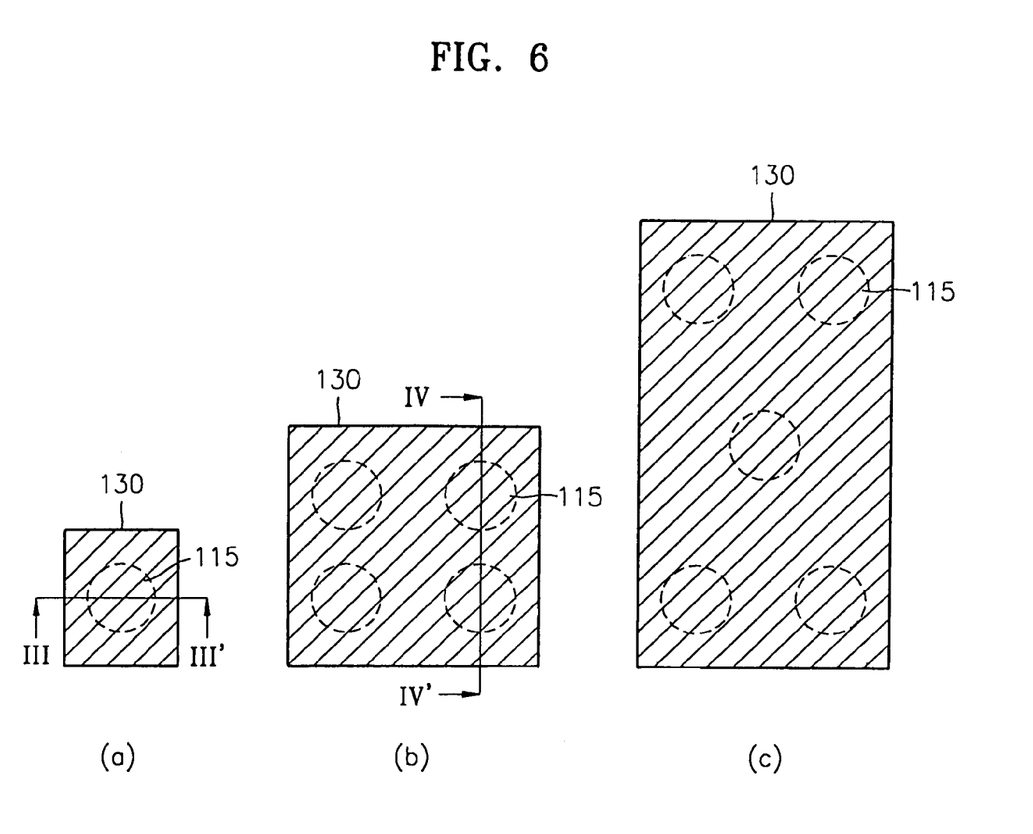
FIG. 6 is an illustration of relationships between the positions of air holes in a dicing tape and a semiconductor chip according to exemplary embodiments of the present invention.

FIG. 6 is an illustration of relationships between the positions of the air holes 115 of the dicing tape 110 and a semiconductor chip 130 according to exemplary embodiments of the present invention. Diagram (a) of FIG. 6 depicts one air hole 115 positioned under a semiconductor chip 130, and may correspond to the exemplary embodiment illustrated in FIG. 3. That is, FIG. 3 may correspond to a cross-section taken along the line III-III' of diagram (a) of FIG. 6. Diagram (b) of FIG. 6 may be suitable for a larger semiconductor chip 130 than the semiconductor chip 130 depicted in diagram (a), and illustrates four air holes 115 positioned under a semiconductor chip 130. Diagram (b) of FIG. 6 may correspond to the exemplary embodiment set forth in FIG. 4, in which two air holes 115 may be positioned under one semiconductor chip 130 in a cross-section of the dicing tape 110. Thus, FIG. 4 may correspond to a cross-section taken along the line IV-IV' of diagram (b) of FIG. 6. Diagram (c) of FIG. 6 is an example of a rectangular semiconductor chip 130, and illustrates five air holes 115 positioned under one semiconductor chip 130.

In exemplary embodiments of the present invention, the size, number, and position of the air holes 115 formed in the dicing tape 110 may be determined according to the size of the semiconductor chip 130. Accordingly, although not described above, various changes to the size, number, and position of air holes may be made and would be easily determined by those of skill in the art. The size, number, and position of the air holes 115 may be determined such that air pressure applied to the semiconductor chip 130 is substantially uniformly distributed throughout the entire area of the semiconductor chip 130.

Various dicing tapes 110 having numerous layouts of air hole distributions may be prepared. As a result, a dicing tape 110 that has an air hole distribution suitable for a size of the selected semiconductor chip 130 may be selected, and subsequent mounting, dicing, and semiconductor chip pick-up processes may be conducted. Alternatively, a dicing tape 110 may be prepared by coating an adhesive layer on a base film and perforating air holes therein which may be suitably distributed for the size of the selected semiconductor chip 130.

While the present invention has been particularly shown and described with reference to exemplary embodiments thereof, it should be understood by those of ordinary skill in the art that various changes in form and details may be made therein without departing from the spirit and scope of the invention as defined by the appended claims.

What is claimed is:

1. A method for removing a semiconductor chip from a dicing tapes, comprising:
    positioning an air dispensing module under the semiconductor chip;
    blowing air through a plurality of air-through holes formed in the dicing tape to at least partially separate the semiconductor chip from the dicing tape;
    positioning a removal member above the semiconductor chip; and
    removing the semiconductor chip from the dicing tape.

2. The method of claim 1, further comprising:
    positioning at least one of the air-through holes in the dicing tape under the semiconductor chip.

3. The method of claim 2, wherein the blown air is directed toward the semiconductor chip to create a space between the semiconductor chip and the dicing tape.

4. The method of claim 1, further comprising:
    vacuum suctioning semiconductor chips that are not to be removed to the dicing tape.

5. The method of claim 1, further comprising:
    adhering the removal member to a surface of the semiconductor chip.

6. The method of claim 5, further comprising:
    moving the removal member a distance from the dicing tape.

7. The method of claim 1, further comprising:
    vacuum suctioning the dicing tape to the air dispensing module.

* * * * *